United States Patent
Boege et al.

(10) Patent No.: US 11,982,412 B1
(45) Date of Patent: May 14, 2024

(54) LED LUMINAIRE WITH VOC BARRIER

(71) Applicant: Dialight Corporation, Farmingdale, NJ (US)

(72) Inventors: Samual Boege, Pine Beach, NJ (US); Chakrakodi Shastry, Princeton, NJ (US); Qi Hong, Morganville, NJ (US); Kevin Rosseter, Ocean, NJ (US); Callan J. McCormick, New Egypt, NJ (US); Michael Bowe, Atlantic Highlands, NJ (US)

(73) Assignee: Dialight Corporation, Farmingdale, NJ (US)

( * ) Notice: Subject to any disclaimer, the term of this patent is extended or adjusted under 35 U.S.C. 154(b) by 0 days.

(21) Appl. No.: 18/093,186

(22) Filed: Jan. 4, 2023

(51) Int. Cl.
*F21K 9/66* (2016.01)
*F21V 19/00* (2006.01)
*F21Y 105/16* (2016.01)

(52) U.S. Cl.
CPC ............. *F21K 9/66* (2016.08); *F21V 19/0015* (2013.01); *F21Y 2105/16* (2016.08)

(58) Field of Classification Search
CPC ........................................................ F21K 9/66
See application file for complete search history.

(56) References Cited

U.S. PATENT DOCUMENTS

2014/0175473 A1* 6/2014 Donofrio ................ H01L 33/44
438/26

* cited by examiner

*Primary Examiner* — Sean P Gramling
(74) *Attorney, Agent, or Firm* — Tong, Rea, Bentley & Kim, LLC

(57) ABSTRACT

The present disclosure is directed to examples of a light emitting diode (LED) device. In one embodiment, the LED device includes a printed circuit board (PCB), at least one LED chip electrically coupled to the PCB, a LED package to encapsulate the at least one LED chip, and at least one volatile organic compound (VOC) barrier layer coating the LED package.

14 Claims, 4 Drawing Sheets

US 11,982,412 B1

LED LUMINAIRE WITH VOC BARRIER

BACKGROUND

Luminaires can be used to illuminate an area. Luminaires can include various types of light sources such as incandescent bulbs or light emitting diodes (LEDs). Currently, LEDs are preferred due to lower energy usage and the ability to provide sufficient light output.

Some LED luminaires can be used for corrosive industrial applications that have high heat and humidity. Luminaires located in such process areas or industrial work sites provide large amounts of light output and require extremely high efficacy.

SUMMARY

In one embodiment, the present disclosure provides a light emitting diode (LED) device with a volatile organic compound (VOC) barrier coating and a method for producing the same. In one embodiment, the LED device comprises a printed circuit board (PCB), at least one LED chip electrically coupled to the PCB, an LED package to encapsulate the at least one LED chip, and at least one volatile organic compound (VOC) barrier layer coating the LED package.

In one embodiment, the present disclosure provides another embodiment of an LED device. In one embodiment, the LED device comprises a printed circuit board (PCB), a plurality of arrays of LED chips electrically coupled to the PCB, an LED package to encapsulate the plurality of arrays of LED chips, a first layer of a VOC barrier layer deposited in a direction parallel to a mid-line of the plurality of arrays of LED chips, and a second layer of the VOC barrier layer deposited in a direction perpendicular to the first layer.

In one embodiment, the present disclosure provides a method. In one embodiment, the method comprises providing a light emitting diode (LED) device, wherein the LED device comprises at least one LED chip and an LED package to enclose the at least one LED chip, applying at least one volatile organic compound (VOC) barrier coating over the entire LED package of the LED device, and curing the at least one VOC barrier coating.

BRIEF DESCRIPTION OF THE DRAWINGS

So that the manner in which the above recited features of the present disclosure can be understood in detail, a more particular description of the disclosure, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

The present disclosure provides LED lights with a volatile organic compound (VOC) barrier coating. As discussed above, luminaires can be used to illuminate an area. Luminaires can include various types of light sources such as incandescent bulbs or light emitting diodes (LEDs). Some LED luminaires can be used for corrosive industrial applications that have high heat and humidity. The high heat and humidity can combine with a polluted atmosphere to rapidly degrade sensitive electronic devices, such as LEDs.

Within some of these harsh applications, VOCs and reactive gases are known to accelerate the failure of LED fixtures and luminaires. In these applications, both VOCs and reactive gases permeate through the LED encapsulation materials. For example, the VOC can accumulate within the LED package, absorbing photonic and thermal energy that result in a changed hydrocarbon bond structure. These bond changes that occur within the VOC molecules can change the color characteristic, cause a reduction in light output from the LED device, cause a loss of luminaire efficiency, and the like. Thus, it may be desirable to provide a high efficacy, reliable lighting solution for these types of harsh applications.

Current LED manufacturers may coat materials to prevent corrosion. Water, water vapor, oxygen, or other reactive gases such as hydrogen sulfide, may contact metallic or conductive elements within the LED package. In the presence of moisture, this oxidation results in corrosion that may cause premature LED failure. These types of coating and etching technologies can protect against corrosive failure mechanisms. However, they fail to address the VOC failure mode described above. VOC failures result from a chemical bond structure change of the VOC itself, and, therefore, existing coatings are unable to prevent the deterioration of the luminaire's performance. In fact, there is no currently available method whereby the LED manufacturer can prevent failure due to VOC. LED manufacturers have gone as far as to state that LEDs should not be used or operated around any potentially hazardous VOCs.

Other LED manufacturers have attempted other solutions to prevent corrosive failure of LEDs. For example, some LED manufacturers have used noble metallic conductors. However, these types of solutions are not suitable for high power industrial luminaires because the efficiency trade-off is too high.

The present disclosure provides a VOC barrier coating that can prevent the transport of the atmospheric pollutants (e.g., VOCs) through the coating or encapsulation of LED lights. Chemical analysis of the LEDs with the VOC barrier coating have shown that LEDs with the VOC barrier coating do not contain VOCs within the enclosed volume or within layers of the LED luminaire.

Figure 1:
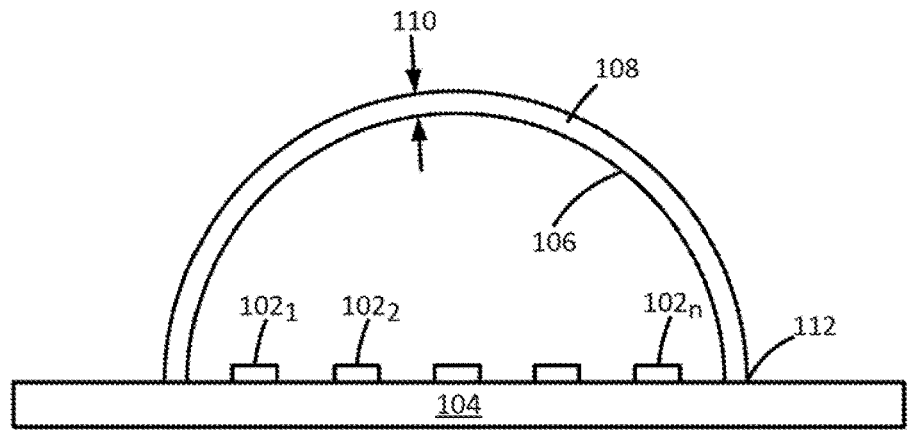
FIG. 1 depicts an example LED with a VOC barrier coating of the present disclosure.

FIG. 1 illustrates an example LED device 100 with a VOC barrier coating 108 of the present disclosure. In one embodiment, the LED device 100 may be an LED based luminaire used in industrial applications with exposure to VOCs in the environment. For example, the LED device 100 may be deployed in harsh industrial environments.

In one embodiment, the LED device 100 may include at least one LED chip 102$_1$ to 102$n$ (hereinafter referred to individually as an LED chip 102 or collectively as LED chips 102). When a plurality of LED chips 102 are deployed, the LED chips 102 may be arranged in arrays or lines. Each LED chip 102 may be any type of LED chip. For example, an LED chip 102 may be an indium gallium nitride (InGaN) based LED, gallium nitride (GaN) based LED, aluminum gallium nitride (AlGaN) based LED, aluminum indium gallium phosphide (AlInGaP) based LED, and the like.

In one embodiment, the LED chip 102 may be electrically coupled to a printed circuit board (PCB) 104. An LED package 106 may encapsulate or cover the LED chip 102 on the PCB 104. The LED package 106 may be optically clear to allow light generated by the LED chip 102 to pass through the LED package 106. In one embodiment, additional coatings may be applied to the LED package 106 for optical purposes. For example, different coatings may be applied to the LED package 106 to provide a desired color (e.g., phosphor coatings to provide a blue color).

In one embodiment, the VOC barrier coating 108 may be applied over the LED package 106 to provide protection in harsh environments from VOCs that can damage the LED chip 102 over time. For example, with the VOC barrier coating 108, LED devices 100 that are exposed to VOC environments were shown to include only chemical compounds expected to be found in the LED devices 100 using Fourier Transform Infrared Spectroscopy (FTIR) analysis.

In one embodiment, the VOC barrier coating 108 may be applied to the entire LED package 106. In one embodiment, the VOC barrier coating 108 may be applied over the entire LED package 106 and over contact points 112 where the LED package 108 meets the PCB 104. In one embodiment, the VOC barrier coating 108 may be applied to the entire LED device (e.g., the LED package 108 and the PCB 104).

The VOC barrier 108 may be fabricated from a polymer. The polymer may be optically clear to allow light generated by the LED chip 102 to pass through the VOC barrier 108 and maintain the light efficiency of the LED device 100. For example, the VOC barrier layer may be fabricated from a cross-linked polymer or an ethylene-polymer coating. In one embodiment, the VOC barrier 108 may be a liquid silicone dioxide coating.

When the VOC barrier 108 is a cross-linked polymer, the cross-linked polymer may be an acrylic polymer that is suspended in a mixture with N-butyl acetate. The percentage of solid acrylic polymer in the suspension may be between 30% to 60% of the entire mixture. In one embodiment, the percentage of solid acrylic polymer may be approximately 40%.

In one embodiment, a thickness 110 of the VOC barrier layer 108 may be between approximately 5 microns to 100 microns. In one embodiment, the thickness 110 of the VOC barrier layer 108 may be between approximately 15 microns to approximately 75 microns.

Figure 2:
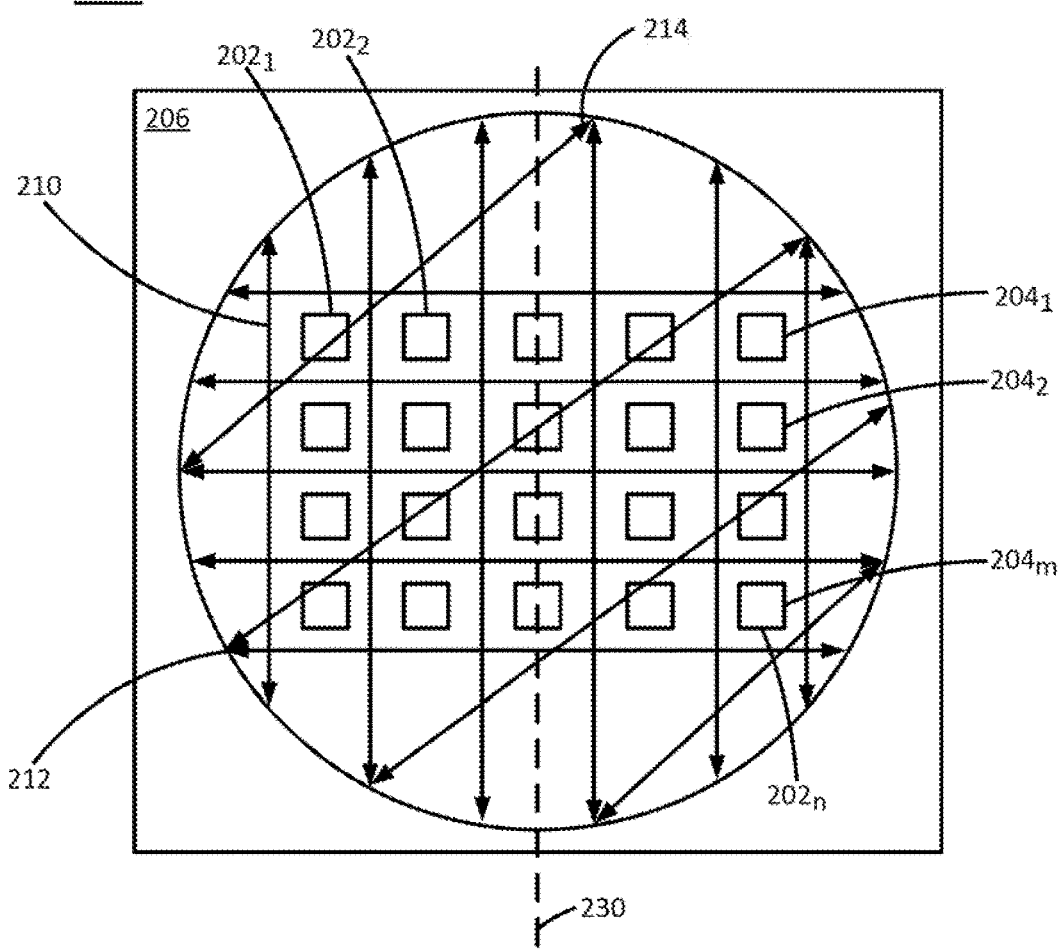
FIG. 2 depicts an example top view of an LED with multiple VOC barrier coatings of the present disclosure.

FIG. 2 illustrates a top view of an LED device 200. The LED device 200 may include a plurality of LED chips $202_1$ to $202_n$ (hereinafter referred to individually as an LED chip 202 or collectively as LED chips 202). The LED chips 202 may be similar to the LED chips 102, described above. The LED chips 202 may be electrically coupled to a PCB 206. In one embodiment, the LED chips 202 may be arranged in arrays, lines, or rows $204_1$ to $204_m$ (hereinafter also referred to as an array 204).

Figure 3:
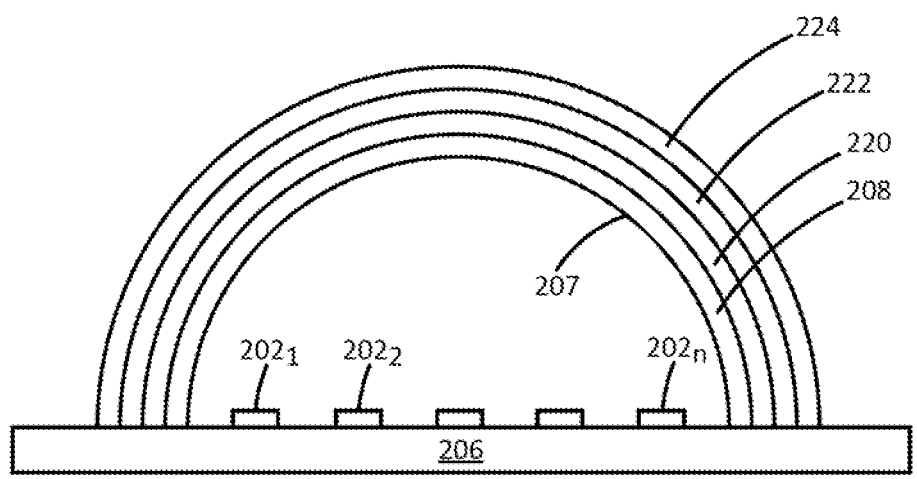
FIG. 3 depicts a cross-sectional side view of the LED with multiple VOC barrier coatings and an optional coating layer of the present disclosure.

FIG. 3 illustrates a cross-sectional side view of the LED device 200. In one embodiment, the LED device 200 may include a LED package 207 to encapsulate the LED chips 202, similar to the LED package 106 illustrated in FIG. 1 and discussed above. In one embodiment, the LED device 200 may include a VOC barrier layer 208 on the LED package 207. The VOC barrier layer 208 may be similar in composition and thickness to the VOC barrier layer 108 illustrated in FIG. 1 and described above.

In one embodiment, the LED device 200 may include multiple layers of the VOC barrier layer 108. For example, the LED device 200 may include a VOC barrier layer 220 and a VOC barrier layer 222. The VOC barrier layers 208, 220, and 222 may be similar in composition, but may differ in thickness and in how the respective VOC barrier layers 208, 220, and 222 are applied.

For example, referring back to FIG. 2, the first VOC barrier layer 208 may be applied in a direction that is parallel to a mid-line 230 of the arrays 204 of LED chips 202. For example, the mid-line 230 may be a line that runs through a center of each array 204 of LED chips 202. A pressurized applicator may be controlled to dispense the first VOC barrier layer 208 in a direction 210 that is parallel to the mid-line 230.

The second VOC barrier layer 220 may be applied in a direction 212 that is perpendicular or normal to the direction 210 of the first VOC barrier layer 208. For example, the second VOC barrier layer 220 may be applied in a direction 212 that is approximately 90 degrees relative to the direction 210 or the mid-line 230.

The third VOC barrier layer 224 may be optional to ensure complete coverage of the LED package 207. The third VOC barrier layer 224 may be applied in a direction 214 that is approximately 45 degrees relative to the direction 210 or 45 degrees relative to the mid-line 230.

In one embodiment, the first VOC barrier layer 208 may have a thickness between approximately 5 microns to 100 microns. In one embodiment, the thickness of the first VOC barrier layer 208 may be between approximately 15 microns to approximately 75 microns. In one embodiment, the first VOC barrier layer 208 may have a thickness of approximately 25 microns.

The thickness of the second VOC barrier layer 220 may be approximately 1.5 times the thickness of the first VOC barrier layer 208. The thickness of the third VOC barrier layer 222 may be greater than 25 microns.

In one embodiment, an optional coating layer 224 may be applied over the VOC barrier layers 208, 220, and 222. The coating layer 224 may also be added over a single VOC barrier layer such as the VOC barrier layer 108 illustrated in FIG. 1. The coating layer 224 may ensure that the VOC barrier layers 208, 220, and 222 stay intact over the LED package 207.

The coating layer 224 may be fabricated from a blend of acrylic and urethane polymers. The coating layer 224 may have a thickness of less than 25 microns.

Thus, the LED devices 100 and 200 of the present disclosure provide LED lighting that can be deployed in harsh environments that may expose the LED devices 100 and 200 to VOCs. The VOC barrier layers 108, 208, 220, and 222 may ensure that the LED chips 102 and/or 202 operate efficiently and improve longevity within the harsh VOC containing environments.

Figure 4:
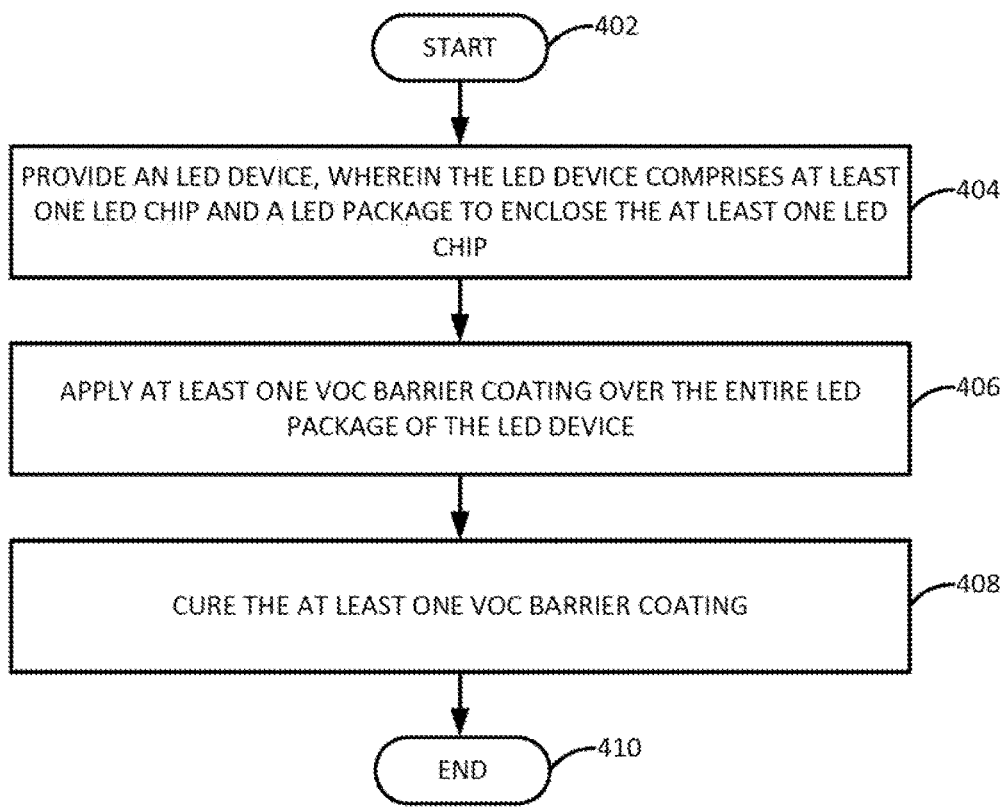
FIG. 4 depicts an example flow chart of a method for applying a VOC barrier coating of the present disclosure.

FIG. 4 illustrates an example flowchart for a method 400 for applying a VOC barrier coating on an LED device of the present disclosure. The method 400 may be executed by various tools or equipment that are under the control of a processor or controller.

The method 400 begins at block 402. At block 404, the method 400 provides a light emitting diode (LED) device, wherein the LED device comprises at least one LED chip and an encapsulating LED package to enclose the at least one LED chip.

At block 406, the method 400 applies at least one volatile organic compound (VOC) barrier coating over the entire encapsulating LED package of the LED device. For example, the VOC barrier coating may include a polymer based coating. The polymer based coating may include a cross-linked polymer, such as an acrylic polymer. The acrylic polymer may be applied as a suspended solution mixture with N-butyl acetate. The solution may be spray coated onto the encapsulating LED package of the LED device.

In one embodiment, the VOC barrier coating may be applied in multiple layers by a pressurized applicator. Each layer may be applied in a different direction. For example, a first layer of the VOC barrier coating may be applied in a direction that is parallel to a mid-line of the arrays of LED chips. A second layer of the VOC barrier coating may be applied in a direction that is perpendicular or normal to the first layer of the VOC barrier coating. A third layer of the VOC barrier coating may be applied in a direction that is off-axis of the first layer of the VOC barrier coating. For example, the third layer may be applied in a direction that is approximately 45 degrees relative to the direction the first layer of the VOC barrier coating was applied.

In one embodiment, the VOC barrier coating may be applied to a desired thickness. If more than one VOC barrier coating layer is applied, each layer may have a different thickness. For example, the first layer may have a first thickness. The second layer may have a thickness that is approximately 1.5 times a thickness of the first layer. The third layer may have a thickness that is different than the first layer and the second layer. In one embodiment, the third layer may have a thickness that is approximately the same as the first layer.

At block 408, the method 400 cures the at least one VOC barrier coating. For example, the VOC barrier coating may be cured with heat or ultra violet (UV) lighting. In some instances, the VOC barrier coating may be spray coated in such a thin layer that the VOC barrier coating may be instantly cured as the VOC barrier coating is being applied.

In one embodiment, additional layers may be added on top of the VOC barrier coating. For example, an optional coating layer may be dispensed on top of the at least one VOC barrier layer. The coating layer may be a blend of acrylic and urethane polymers. The coating layer may be dispensed by the same pressurized applicator that applied the VOC barrier coating, or may be dispensed by a different pressurized applicator. At block 410, the method 400 ends.

Figure 5:
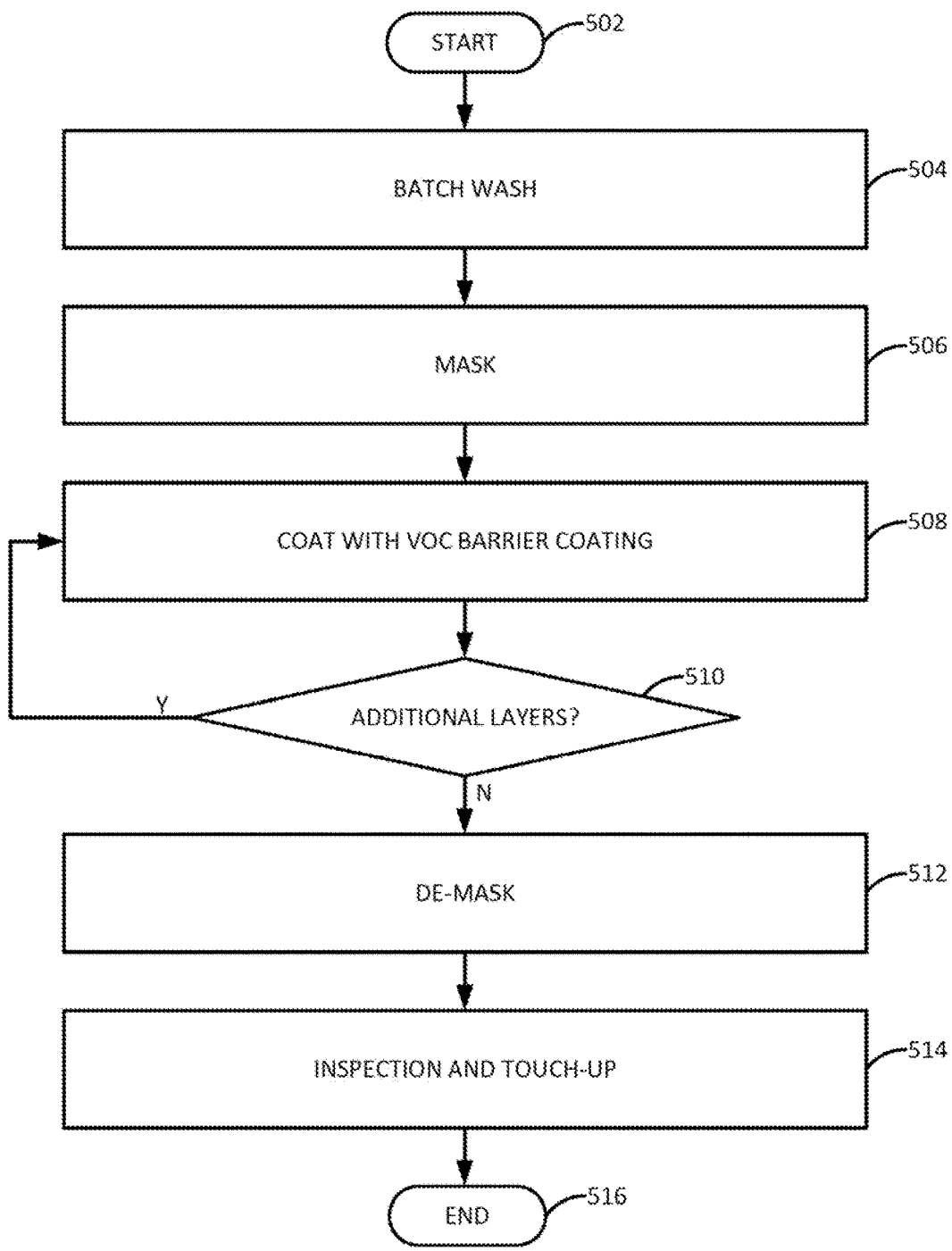
FIG. 5 depicts another example flow chart of a method for applying a VOC barrier coating of the present disclosure.

FIG. 5 illustrates an example flowchart of another method 500 for applying a VOC barrier coating on an LED device of the present disclosure. The method 500 may be executed by various tools or equipment that are under the control of a processor controller.

At block 502, the method 500 begins. At block 504, the method 500 performs a batch wash. For example, a batch of LED devices that are to receive a VOC barrier coating may be provided. The LED devices may be washed in a non-aqueous batch wash for a 2.5 hour cycle.

At block 506, the method 500 performs a masking step. For example, the mask may be a metal mask or polymer based mask that is non-reactive with the compounds in the LED devices or in the VOC barrier coating. The mask may be applied to the LED devices to cover any areas where the VOC barrier coating is not desired. In other words, the mask may be applied to define the areas that will receive the VOC barrier coating.

At block 508, the method 500 coats the masked LED devices with a VOC barrier coating. For example, the VOC barrier coating may be a polymer based coating. The polymer based coating may include a cross-linked polymer or an ethylene-polymer. In one embodiment, the VOC barrier coating may be a liquid silicone dioxide.

When the VOC barrier coating is a cross-linked polymer, the cross-linked polymer may be an acrylic polymer that is suspended in a mixture with N-butyl acetate. In an example, the solids ratio of the mixture may be 40% and 60% N-butyl acetate. The solids content when dry may be a minimum of 20%. In an example, the acrylic polymer may be applied to a wet thickness of 3 mils (or approximately 76.2 microns). The cured thickness may be approximately 3 mils+/−1 mil.

In the example, the acrylic polymer may be dispensed by a pressurized applicator having a holding tank pressure of 10 pounds per square inch (PSI). The pressure at the nozzle of the pressurized applicator may be approximately 5.5 PSI. The nozzle may be held at a height above the LED devices of approximately 10.5 inches+/−0.2 inches. The acrylic polymer may be dry mist cured at the time of dispensing. As a result, no additional heat or UV curing may be necessary.

At block 510, the method 500 determines if additional layers are to be applied. If the answer to block 510 is yes, the method 500 may return to block 508 to add an additional coat or layer of the VOC barrier coating. The additional layers of the VOC barrier coating may have different thicknesses. For example, the thickness of the second layer of the VOC barrier coating may be 1.5 times a thickness of the first layer of the VOC barrier coating.

If the answer to block 510 is no, the method 500 may proceed to block 512. At block 512, the method 500 performs a de-masking step. For example, the mask may be removed.

At block 514, the method 500 may perform an inspection and touch-up. For example, the LED device may be inspected to ensure that the VOC barrier coating was properly applied. If any gaps in the VOC barrier coating is noted during inspection, additional VOC barrier coating may be applied to fill any detected gaps. At block 516, the method 500 ends.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A light emitting diode (LED) device, comprising:
   a printed circuit board (PCB);
   at least one LED chip electrically coupled to the PCB;
   a LED package to encapsulate the at least one LED chip; and
   at least one volatile organic compound (VOC) barrier layer coating the LED package, wherein the at least one VOC barrier layer comprises a cross-linked polymer, wherein the cross-linked polymer comprises an acrylic polymer, wherein the acrylic polymer is suspended in a mixture with N-butyl acetate.

2. The LED device of claim 1, wherein the at least one VOC barrier layer coats the entire LED package.

3. The LED device of claim 1, wherein the at least one VOC barrier layer has a thickness of between approximately 25 microns to approximately 100 microns.

4. The LED device of claim 3, wherein the at least one VOC barrier layer has a thickness of between approximately 35 microns to approximately 75 microns.

5. The LED device of claim 1, further comprising:
   a coating layer on top of the at least one VOC barrier layer.

6. The LED device of claim 5, wherein the coating layer comprises a blend of acrylic and urethane polymers.

7. A light emitting diode (LED) device, comprising:
a printed circuit board (PCB);
a plurality of arrays of LED chips electrically coupled to the PCB;
a LED package to encapsulate the plurality of arrays of LED chips;
a first layer of a VOC barrier layer deposited in a direction parallel to a mid-line of the plurality of arrays of LED chips; and
a second layer of the VOC barrier layer deposited in a direction perpendicular to the first layer, wherein the first layer of the VOC barrier layer and the second layer of the VOC barrier layer comprise an acrylic polymer suspended in a mixture with N-butyl acetate.

8. The LED device of claim 7, wherein the second layer of the VOC barrier layer has a thickness that is approximately 1.5 times a thickness of the first layer of the VOC barrier layer.

9. A light emitting diode (LED) device, comprising:
a printed circuit board (PCB);
a plurality of arrays of LED chips electrically coupled to the PCB;
a LED package to encapsulate the plurality of arrays of LED chips;
a first layer of a VOC barrier layer deposited in a direction parallel to a mid-line of the plurality of arrays of LED chips;
a second layer of the VOC barrier layer deposited in a direction perpendicular to the first layer; and
a third layer of the VOC barrier layer deposited in a direction that is 45 degrees off axis relative to the first layer of the VOC barrier.

10. The LED device of claim 9, wherein the third layer of the VOC barrier layer has a thickness that is greater than 25 microns.

11. The LED device of claim 9, further comprising:
a coating layer on top of the third layer of the VOC barrier layer, wherein the coating layer comprises a blend of acrylic and urethane polymers.

12. The LED device of claim 11, wherein the coating layer has a thickness less than 25 microns.

13. A method, comprising:
providing a light emitting diode (LED) device, wherein the LED device comprises at least one LED chip and an encapsulating LED package to enclose the at least one LED chip;
applying at least one volatile organic compound (VOC) barrier coating over the entire encapsulating LED package of the LED device, wherein the at least one VOC barrier coating comprises a suspended mixture of approximately 40 percent acrylic polymer and 60 percent n-butyl acetate; and
curing the at least one VOC barrier coating.

14. The method of claim 13, wherein the applying comprises:
masking the LED device to only expose portions of the LED device that are to receive the at least one VOC barrier coating; and
spray coating the at least one VOC barrier coating onto the portions of the LED device that are exposed by the masking.

* * * * *